United States Patent
Shim et al.

(10) Patent No.: US 9,922,959 B2
(45) Date of Patent: Mar. 20, 2018

(54) SEMICONDUCTOR DEVICE

(71) Applicant: SK hynix Inc., Gyeonggi-do (KR)

(72) Inventors: Seok-Bo Shim, Gyeonggi-do (KR); Seok-Cheol Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 119 days.

(21) Appl. No.: 15/185,992

(22) Filed: Jun. 17, 2016

(65) Prior Publication Data

US 2016/0300818 A1 Oct. 13, 2016

Related U.S. Application Data

(62) Division of application No. 13/232,368, filed on Sep. 14, 2011, now Pat. No. 9,397,672.

(30) Foreign Application Priority Data

Feb. 9, 2011 (KR) .......................... 10-2011-0011484

(51) Int. Cl.
*H05K 7/00* (2006.01)
*H01L 25/065* (2006.01)
(Continued)

(52) U.S. Cl.
CPC .......... *H01L 25/0657* (2013.01); *G11C 5/025* (2013.01); *G11C 5/063* (2013.01); *G11C 29/023* (2013.01); *G11C 29/025* (2013.01); *G11C 29/028* (2013.01); *H01L 22/32* (2013.01); *H01L 22/34* (2013.01); *H01L 23/49838* (2013.01); *H01L 24/06* (2013.01); *H01L 24/48* (2013.01); *H03L 7/08* (2013.01); *H03L 7/0816* (2013.01); *H01L 2224/05554* (2013.01); *H01L 2224/32145* (2013.01); *H01L 2224/32245* (2013.01); *H01L 2224/48091* (2013.01); *H01L 2224/48227* (2013.01); *H01L 2224/49175* (2013.01);
(Continued)

(58) Field of Classification Search
USPC .................................................. 361/760, 807
See application file for complete search history.

(56) References Cited

U.S. PATENT DOCUMENTS 5,444,311 A * 8/1995 Imai .................. H01L 23/50
257/E23.079
5,668,931 A * 9/1997 Dermer .................. G06K 15/00
358/1.1

(Continued)

*Primary Examiner* — Adam Houston
(74) *Attorney, Agent, or Firm* — IP & T Group LLP

(57) ABSTRACT

A semiconductor device includes a package substrate having a plurality of external connection terminals disposed on a first surface thereof and a plurality of internal connection terminals disposed on a second surface thereof and electrically connected with corresponding one of the external connection terminals, a first semiconductor chip stacked over the second surface of the package substrate and having a first flag pad for providing first information and a first internal circuit for adjusting a parameter by a first correction value in response to the first information provided from the first flag pad, and a second semiconductor chip stacked over the first semiconductor chip and having a second flag pad for providing second information and a second internal circuit for adjusting the parameter by a second correction value in response to the second information provided from the second flag pad.

19 Claims, 10 Drawing Sheets

(51) Int. Cl.
  *G11C 5/02*   (2006.01)
  *G11C 5/06*   (2006.01)
  *G11C 29/02*  (2006.01)
  *H01L 23/00*  (2006.01)
  *H01L 21/66*  (2006.01)
  *H03L 7/081*  (2006.01)
  *H01L 23/498* (2006.01)
  *H03L 7/08*   (2006.01)

(52) U.S. Cl.
  CPC ........... *H01L 2224/73265* (2013.01); *H01L 2225/0651* (2013.01); *H01L 2225/06565* (2013.01); *H01L 2225/06596* (2013.01); *H01L 2924/00014* (2013.01); *H01L 2924/1436* (2013.01); *H01L 2924/15311* (2013.01); *H01L 2924/3011* (2013.01)

(56) References Cited

U.S. PATENT DOCUMENTS

| | | | | |
|---|---|---|---|---|
| 5,682,462 | A * | 10/1997 | Huang | G10L 19/06 704/219 |
| 6,859,404 | B1 * | 2/2005 | Kim | G11C 7/1051 327/161 |
| 7,430,141 | B2 * | 9/2008 | Bonelli | G11C 7/1078 365/193 |
| 7,477,083 | B2 * | 1/2009 | Fujisawa | G11C 7/1051 327/147 |
| 7,999,367 | B2 * | 8/2011 | Kang | G11O 5/02 257/678 |
| 8,233,303 | B2 * | 7/2012 | Best | G11O 5/02 365/51 |
| 8,897,053 | B1 * | 11/2014 | Stephens, Jr. | G11C 11/40615 365/193 |
| 9,201,777 | B2 * | 12/2015 | Hsu | G06F 12/00 |
| 9,286,948 | B2 * | 3/2016 | Loh | G11C 5/02 |
| 2005/0082664 | A1 * | 4/2005 | Funaba | H01L 23/544 257/724 |
| 2005/0108600 | A1 * | 5/2005 | Arguelles | G01R 31/31715 714/701 |
| 2005/0139977 | A1 * | 6/2005 | Nishio | G06F 1/184 257/686 |
| 2006/0052961 | A1 * | 3/2006 | Best | G06F 13/1689 702/106 |
| 2006/0076676 | A1 * | 4/2006 | Fratti | H01L 25/0657 257/728 |
| 2006/0233012 | A1 * | 10/2006 | Sekiguchi | G11C 5/02 365/51 |
| 2007/0158825 | A1 * | 7/2007 | Meir | G11C 29/883 257/723 |
| 2007/0228546 | A1 * | 10/2007 | So | H01L 25/0657 257/690 |
| 2011/0084385 | A1 * | 4/2011 | Itaya | H01L 21/563 257/737 |
| 2011/0184688 | A1 * | 7/2011 | Uetake | G11C 29/40 702/120 |
| 2011/0187408 | A1 * | 8/2011 | Byeon | H03K 19/173 326/37 |
| 2011/0292708 | A1 * | 12/2011 | Kang | H01L 23/481 365/63 |
| 2012/0200329 | A1 * | 8/2012 | Shim | H01L 24/48 327/158 |
| 2012/0265928 | A1 * | 10/2012 | Mun | G11C 16/10 711/103 |
| 2013/0010515 | A1 * | 1/2013 | Nishioka | G11C 7/1093 365/51 |
| 2013/0135010 | A1 * | 5/2013 | Kondo | G11O 5/02 326/82 |
| 2015/0008985 | A1 * | 1/2015 | Kuramochi | H03B 5/1228 331/25 |
| 2015/0318461 | A1 * | 11/2015 | Jacobsen | H03H 9/175 331/155 |
| 2015/0364170 | A1 * | 12/2015 | Clovis | G06F 13/4291 365/189.02 |

\* cited by examiner

SEMICONDUCTOR DEVICE

CROSS-REFERENCE TO RELATED APPLICATIONS

This application is a division of U.S. patent application Ser. No. 13/232,368 filed on Sep. 14, 2011, which claims priority of Korean Patent Application No. 10-2011-0011484, filed on Feb. 9, 2011. The disclosure of each of the foregoing applications is incorporated herein by reference in its entirety.

BACKGROUND

1. Field

Exemplary embodiments of the present invention relate to a semiconductor design technology, and more particularly, to an AC parameter control technology of a semiconductor device.

2. Description of the Related Art

In the present specification, a semiconductor memory device will be explained for example.

In general, a semiconductor memory device such as a DRAM is packaged by stacking a plurality of semiconductor chips (or dies) to achieve a large capacity of data storage in a limited area. When compared to a semiconductor memory device having a single semiconductor chip packaged (a single die package: SDP), in a semiconductor memory device having plural semiconductor chips stack-packaged, e.g. a dual die package (DDP) having two chips or a quad die package (QDP) having four chips, bonding wires may differ in length for respective stacked semiconductor chips.

FIG. 1 is a side view schematically illustrating a semiconductor memory device (DDP) in which two semiconductor chips are stack-packaged.

Referring to FIG. 1, a bonding wire W1 for connecting a package substrate with the semiconductor chip stacked first on the package substrate may be shorter than a bonding wire W2 for connecting the package substrate with the semiconductor chip stacked second over the package substrate. Therefore, when signals are outputted from the respective semiconductor chips for the same use, timing differences are caused in the signals due to differences in the lengths of the bonding wires W1 and W2. That is to say, the signal outputted from the first stacked semiconductor chip and the signal outputted from the second stacked semiconductor chip are finally transmitted to an external controller at different times due to different positional conditions.

For example, in a semiconductor memory device using a delay locked loop (DLL), data strobe signals are transferred from a plurality of stacked semiconductor chips through bonding wires and are finally provided to an external controller through a package substrate. At this time, the data strobe signal outputted from a semiconductor chip stacked at the bottom is provided to the external controller through a relatively short bonding wire, and the data strobe signal outputted from a semiconductor chip stacked at the top is provided to the external controller through a relatively long bonding wire. Since different delay values are applied to the respective data strobe signals outputted from the plurality of stacked semiconductor chips due to differences in the lengths of the bonding wires, the respective data strobe signals reach the external controller at different times. A parameter tDQSCK that represents a skew between an external clock signal and a data strobe signal is prescribed in a specification for a proper operation of a semiconductor memory device. In this regard, if the parameter tDQSCK goes beyond a defined range due to different delay values as described above, the semiconductor memory device may malfunction in a read operation.

In order to prevent the above malfunction, the delay amounts of DLLs included in respective semiconductor chips may be corrected in correspondence to positional conditions. That is to say, in the conventional art, the delay amounts of the DLLs included in the remaining stacked semiconductor chips are corrected based on the delay amount of the DLL included in a lowermost semiconductor chip. To this end, correction circuits are provided in the remaining semiconductor chips excluding the lowermost semiconductor chip. Fuse circuits may be used as the correction circuits, and the delay amounts of the DLLs are corrected using the output signals of the fuse circuits through a fuse cutting process. However, in the case where the correction circuits are provided as described above, since an additional process such as the fuse cutting process is to be performed, the manufacturing costs increase and the manufacturing period is lengthened. Moreover, since the semiconductor chips (the upper stacked semiconductor chips) with the correction circuits and the semiconductor chip (the lowermost semiconductor chip) without a correction circuit are stack-packaged, the respective chips are to be manufactured through different mask patterning processes. Hence, the manufacturing costs and the manufacturing time may further increase.

SUMMARY

An embodiment of the present invention is directed to a semiconductor device in which AC parameters tDQSCK of a plurality of stacked semiconductor chips are controlled within a defined range and all the plurality of stacked semiconductor chips are manufactured through the same mask patterning process.

Another embodiment of the present invention is directed to a semiconductor device capable of controlling AC parameters tDQSCK of a plurality of stacked semiconductor chips with a minimized area.

In accordance with an embodiment of the present invention, a semiconductor device includes: at least one flag pad configured to provide chip stack information for a stack sequence of semiconductor chips; and an internal circuit configured to adjust a parameter of the semiconductor device in response to at least one of the chip stack information provided from the flag pad.

In accordance with another embodiment of the present invention, a semiconductor device includes: a package substrate having a plurality of external connection terminals disposed on a first surface thereof and a plurality of internal connection terminals disposed on a second surface thereof and electrically connected with corresponding one of the external connection terminals; a first semiconductor chip stacked over the second surface of the package substrate, and having a first flag pad for providing first information and a first internal circuit for adjusting a parameter of the semiconductor device by a first correction value in response to the first information provided from the first flag pad; and a second semiconductor chip stacked over the first semiconductor chip, and having a second flag pad for providing second information and a second internal circuit for adjusting the parameter by a second correction value in response to the second information provided from the second flag pad.

In accordance with yet another embodiment of the present invention, a semiconductor device includes: at least one first pad configured to provide wafer test information at a wafer level of the semiconductor device and provide chip stack information for a stack sequence of semiconductor chips at a package level of the semiconductor device; at least one test circuit configured to perform a test operation in response to the wafer test information provided from the first pad at the wafer level; and an internal circuit configured to adjust a parameter of the semiconductor device in response to the chip stack information provided from the first pad at the package level.

In accordance with still another embodiment of the present invention, a semiconductor device includes: a package substrate having a plurality of external connection terminals disposed on a first surface thereof and a plurality of internal connection terminals disposed on a second surface thereof and electrically connected with corresponding one of the external connection terminals; a first semiconductor chip stacked over the second surface of the package m substrate, and having a first pad for providing first wafer test information at a wafer level of the semiconductor device and providing first chip stack information for a stack sequence of the first semiconductor chip at a package level of the semiconductor device, a first test circuit for performing a test operation in response to the first wafer test information provided from the first pad at the wafer level, and a first internal circuit for adjusting a parameter of the semiconductor device by a first correction value in response to the first chip stack information provided from the first pad at the package level; and a second semiconductor chip stacked over the first semiconductor chip, and having a second pad for providing second wafer test information at the wafer level and providing second chip stack information for a stack sequence of the second semiconductor chip at the package level, a second test circuit for performing a test operation in response to the second wafer test information provided from the second pad at the wafer level, and a second internal circuit for adjusting the parameter by a second correction value in response to the second chip stack information provided from the second pad at the package level.

DETAILED DESCRIPTION

Figure 1:
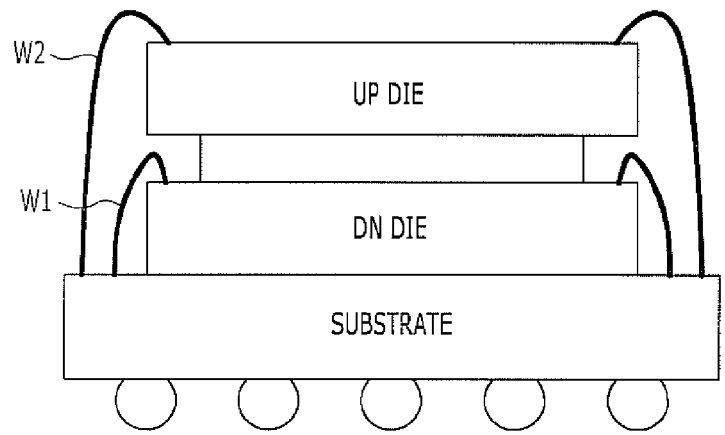
FIG. 1 is a side view schematically illustrating a stack-packaged semiconductor memory device (DDP).

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the embodiments of the present invention, a semiconductor memory device (dual die package: DDP), in which two semiconductor chips are stacked on a package substrate, will be exemplified for the sake of convenience in explanation. Also, in order to clearly show the subject matters of the present invention, a semiconductor chip first stacked on a package substrate and a semiconductor chip second stacked over the package substrate will be separately described.

First Embodiment

Figure 2:
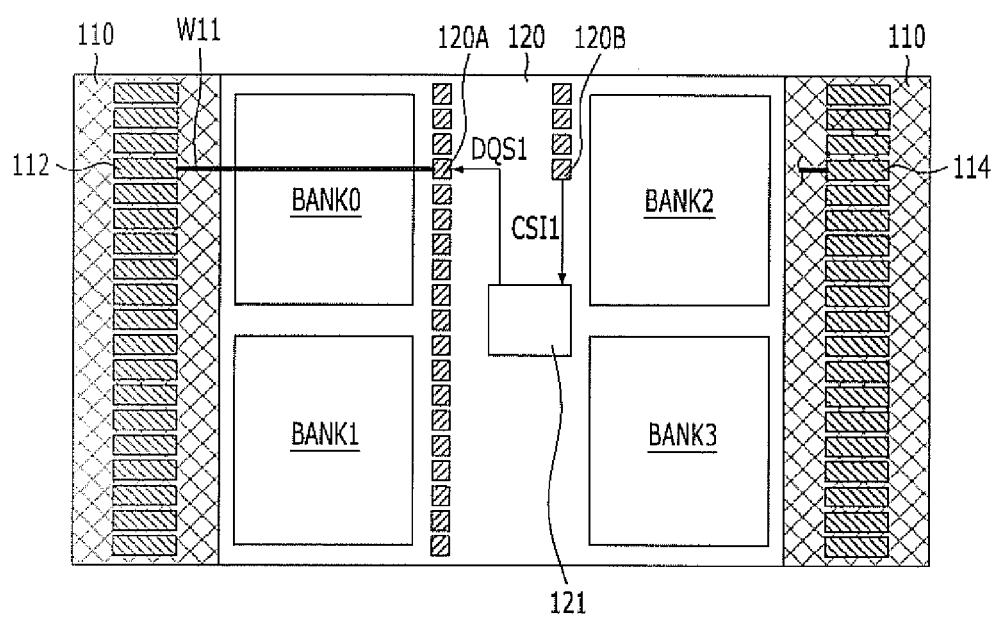
FIG. 2 is a plan view illustrating a package substrate and a first semiconductor chip first stacked on the package substrate in a semiconductor memory device (DDP) in accordance with a first embodiment of the present invention.

First, FIG. 2 is a plan view illustrating a package substrate 110 and a first semiconductor chip 120 first stacked on the package substrate 110 in a semiconductor memory device (DDP) in accordance with a first embodiment of the present invention.

Referring to FIG. 2, the semiconductor memory device (DDP) in accordance with the first embodiment of the present invention includes a package substrate 110 including first internal connection terminals 112, a first semiconductor chip 120 first stacked on the package substrate 110 and including a first signal pad 120A for outputting a first data strobe signal DQS1, and a first wire W11 electrically connecting the first internal connection terminal 112 with the first signal pad 120A.

The package substrate 110 has a lower surface, on which a plurality of external connection terminals (not shown) for interfacing with an external controller (not shown) using various signals and power are disposed, and an upper surface on which a plurality of internal connection terminals for interfacing with the first semiconductor chip 120 and a second semiconductor chip 140 to be described later using various signals and power are disposed. For reference, corresponding terminals of the plurality of external connection terminals and the plurality of internal connection terminals are electrically connected with each other in a routing method.

The first semiconductor chip 120 includes a first flag pad 120B configured to provide first chip stack information CSI1 corresponding to a stack sequence of semiconductor chips and a first internal circuit 121 configured to correct or adjust an AC parameter based on the first chip stack information CSI1 provided from the first flag pad 120B. The AC parameter means a parameter tDQSCK that indicates a skew between an external clock signal and a data strobe signal in a read operation.

The first flag pad 120B is additionally provided not to be connected with any internal connection terminal. Accordingly, the first flag pad 120B is in a floating state, and the first chip stack information CSI1 has a high impedance (Hi-Z) value.

In order to correct or adjust the AC parameter tDQSCK by a first correction value based on the first chip stack information CSI1, the first internal circuit 121 outputs the first data strobe signal DQS1 on which a first delay value corresponding to the first correction value is reflected, to the first signal pad 120A.

Figure 3:
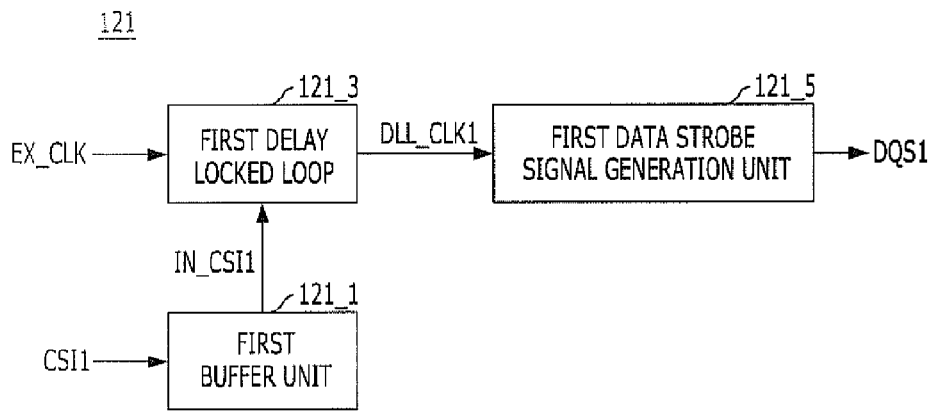
FIG. 3 is a block diagram illustrating an exemplary embodiment of the first internal circuit shown in FIG. 2.
Figure 4:
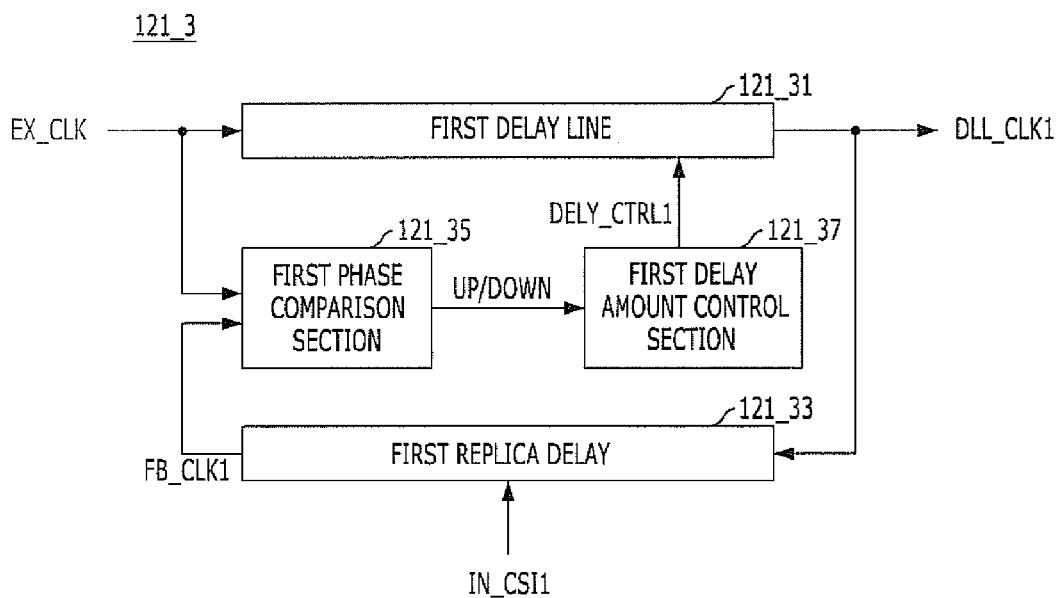
FIG. 4 is a block diagram illustrating an exemplary embodiment of the first delay locked loop shown in FIG. 3.

FIG. 3 is a block diagram illustrating the internal configuration of the first internal circuit 121 shown in FIG. 2, and FIG. 4 is a block diagram illustrating an exemplary embodiment of a first delay locked loop 121_3 shown in FIG. 3.

Referring to FIG. 3, the first internal circuit 121 includes a first buffer unit 121_1, the first delay locked loop 121_3, and a first data strobe signal generation unit 121_5.

The first buffer unit 121_1 is configured to receive the first chip stack information CSI1 and output first internal chip stack information IN_CSI1. The first buffer unit 121_1 may output the first internal chip stack information IN_CSI1 of a logic low level when the first chip stack information CSI1 of a high impedance (Hi-Z) value is inputted.

The first delay locked loop 121_3 is configured to control the delay value of the first replica delay (see FIG. 4) included therein in response to the first internal chip stack information IN_CSI1, delay an external clock signal EX_CLK by the controlled delay value, and output a first delayed clock signal DLL_CLK1. Referring to FIG. 4, the first delay locked loop 121_3 includes a first delay line 121_31 configured to delay the external clock signal EX_CLK by a delay time for delay locking and output the delay-locked first delayed clock signal DLL_CLK1, a first replica delay 121_33 configured to delay the first delayed clock signal DLL_CLK1 by a delay value acquired by modeling an internal delay element and output a first feedback clock signal FB_CLK1 in which a first delay value is additionally included in the acquired delay value (i.e., a default value) in response to the first internal chip stack information IN_CSI1, a first phase comparison section 121_35 configured to compare the phases of the external clock signal EX_CLK and the first feedback clock signal FB_CLK1, and a first delay amount control section 121_37 configured to generate a first control signal DELY_CTRL1 for controlling the delay amount of the first delay line 121_31 in response to an output signal UP/DOWN of the first phase comparison section 121_35.

Referring back to FIG. 3, the first data strobe signal generation unit 121_5 is configured to generate the first data strobe signal DQS1 in response to the first delayed clock signal DLL_CLK1. Accordingly, the first data strobe signal DQS1 has the same phase as the first delayed clock signal DLL_CLK1.

Figure 5:
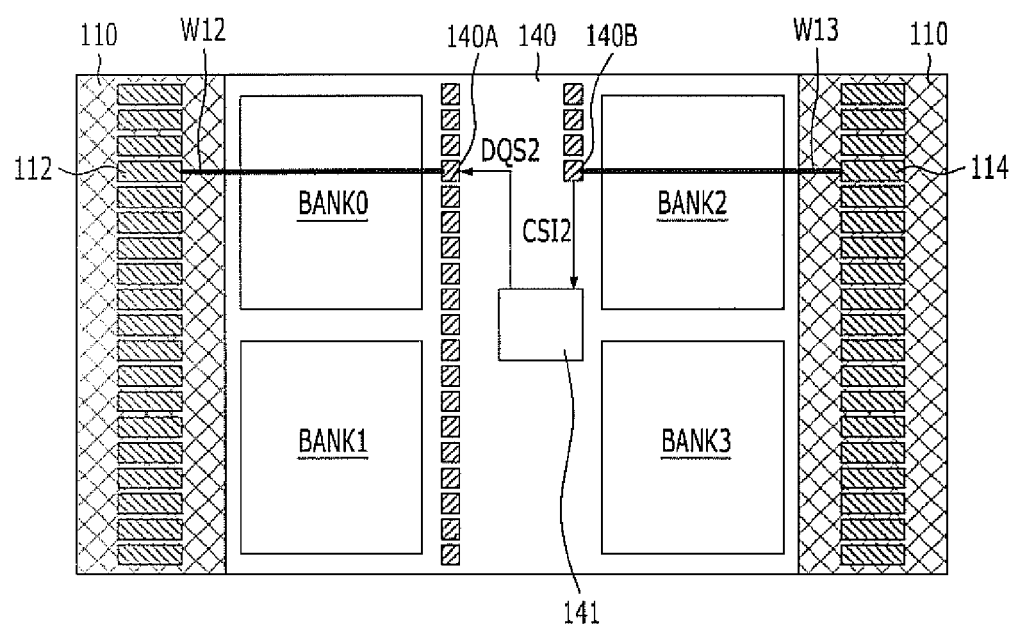
FIG. 5 is a plan view illustrating the package substrate and a second semiconductor chip second stacked over the package substrate in the semiconductor memory device (DDP) in accordance with the first embodiment of the present invention.

FIG. 5 is a plan view illustrating the package substrate 110 and the second semiconductor chip 140 second stacked over the package substrate 110, that is, on the first semiconductor chip 120, in the semiconductor memory device (DDP) in accordance with the first embodiment of the present invention.

Referring to FIG. 5, the semiconductor memory device (DDP) in accordance with the first embodiment of the present invention includes the package substrate 110 including first and second internal connection terminals 112 and 114, the second semiconductor chip 140 second stacked over the package substrate 110 and including a second signal pad 140A for outputting a second data strobe signal DQS2 and a second flag pad 140B for providing second chip stack information CSI2 corresponding to a stack sequence of semiconductor chips, a second wire W12 configured to electrically connect the first internal connection terminal 112 with the second signal pad 140A, and a third wire W13 configured to electrically connect the second internal connection terminal 114 with the second flag pad 140B. The second internal connection terminals 114 are terminals for supplying a power supply voltage VDD applied from the external controller.

As described above, the package substrate 110 functions to transfer signals and powers between the first and second semiconductor chips 120 and 140 and the external controller.

The second semiconductor chip 140 includes a second internal circuit 141 configured to correct or adjust a skew tDQSCK between the external clock signal and the second data strobe signal DQS2 in response to the second chip stack information CSI2 provided from the second flag pad 140B.

The second flag pad 140B is additionally provided, like the first flag pad 120B, but is connected with the second internal connection terminal 114 through the third bonding wire W13, unlike the first flag pad 120B. Accordingly, the second flag pad 140B is supplied with the power supply voltage VDD through the third bonding wire W13, and thus, the second chip stack information CSI2 has a logic high level.

The second internal circuit 141 outputs the second data strobe signal DQS2, which is corrected by a second correction value, to the second signal pad 140A in response to the second chip stack information CSI2.

Figure 6:
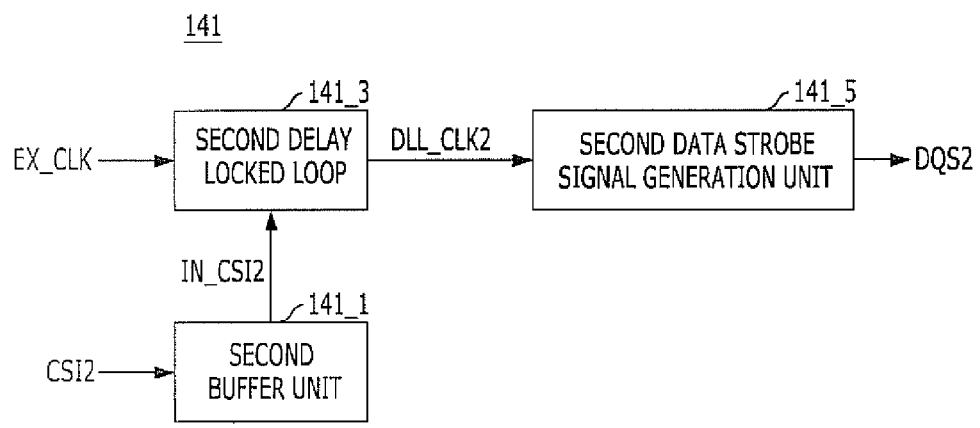
FIG. 6 is a block diagram illustrating an exemplary embodiment of the second internal circuit shown in FIG. 5.

FIG. 6 is a block diagram illustrating the internal configuration of the second internal circuit 141.

Referring to FIG. 6, the second internal circuit 141 includes a second buffer unit 141_1, a second delay locked loop 141_3, and a second data strobe signal generation unit 141_5.

The second buffer unit 141_1 is configured to receive the second chip stack information CSI2 and output second internal chip stack information IN_CSI2. The second buffer unit 141_1 may output the second internal chip stack information IN_CSI2 of a logic high level when the first chip stack information CSI1 of a logic high level is inputted.

The second delay locked loop 141_3 is configured to control the delay value of the first replica delay (not shown) included therein in response to the second internal chip stack information IN_CSI2, delay the external clock signal EX_CLK by the controlled delay value, and output a second delayed clock signal DLL_CLK2. Since the second delay locked loop 141_3 has the same configuration as the first delay locked loop 121_3 described above (see FIG. 4), detailed description thereof will be omitted herein. For reference, while the second replica delay included in the second delay locked loop 141_3 is set to have a delay value acquired through modeling of an internal delay element as a default, a second delay value is additionally included in the set delay value in response to the second internal chip stack information IN_CSI2.

The second data strobe signal generation unit 141_5 is configured to generate the second data strobe signal DQS2 in response to the second delayed clock signal DLL_CLK2. Accordingly, the second data strobe signal DQS2 has the same phase as the second delayed clock signal DLL_CLK2.

Hereafter, operations of the semiconductor memory device (DDP) configured as mentioned above will be described.

In the first embodiment of the present invention, the case of correcting the AC parameter tDQSCK of the second semiconductor chip 140 based on the AC parameter tDQSCK of the first semiconductor chip 120 will be exemplified. That is, a second correction value has a predetermined value while a first correction value is '0'. In other words, since the first and second bonding wires W11 and W12 having different lengths have different delay elements, a series of operations for compensating for the delay element of the second bonding wire W12 are performed such that the delay element of the second bonding wire W12 having a relatively long length can correspond to the delay element of the first bonding wire W11 having a relatively short length.

First, since the first flag pad 120B of the first semiconductor chip 120 is not connected with any internal connection terminal which is disposed on the package substrate 110, the first flag pad 120B is in a floating state. According to this fact, the first chip stack information CSI1 provided through the first flag pad 120B has a high impedance (Hi-Z) value, and the first internal circuit 121 provided with the first chip stack information CSI1 outputs the first data strobe signal DQS1, on which only a modeled delay value is reflected, to the first signal pad 120A.

Describing in detail the operations of the first internal circuit 121, the first buffer unit 121_1 outputs the first internal chip stack information IN_CSI1 of a logic low level in response to the first chip stack information CSI1 of the high impedance (Hi-Z) value. The first delay locked loop 121_3 maintains the delay value of the first replica delay to have a preset default value in response to the first internal chip stack information IN_CSI1 of a logic low level, delay the external clock signal EX_CLK by the maintained delay value, and outputs the first delayed clock signal DLL_CLK1. The first data strobe signal generation unit 121_5 generates the first data strobe signal DQS1 of the same phase as the first delayed clock signal DLL_CLK1 in response to the first delayed clock signal DLL_CLK1, and the first data strobe signal DQS1 is outputted to the first signal pad 120A.

The first data strobe signal DQS1 applied to the first signal pad 120A is transferred to the first internal connection terminal 112 through the first bonding wire W11 and is finally transferred to the external controller through the package substrate 110.

Since the second flag pad 140B of the second semiconductor chip 140 is connected with the second internal connection terminal 114 disposed on the package substrate 110, the second flag pad 140B is provided with the power supply voltage VDD. According to this fact, the second chip stack information CSI2 provided through the second flag pad 140B has a logic high level, and the second internal circuit 141 provided with the second chip stack information CSI2 of the logic high level outputs the second data strobe signal DQS2, on which the second delay value as well as the modeled delay value is reflected, to the second signal pad 140A.

Describing in detail the operations of the second internal circuit 141, the second buffer unit 141_1 outputs the second internal chip stack information IN_CSI2 of a logic high level in response to the second chip stack information CSI1 of the logic high level. The second delay locked loop 141_3 controls the delay value of the second replica delay to have the summed value of a preset default value and the second delay value in response to the second internal chip stack information IN_CSI2 of the logic high level, delays the external clock signal EX_CLK by the controlled delay value, and outputs the second delayed clock signal DLL_CLK2. The second data strobe signal generation unit 141_5 generates the second data strobe signal DQS2 of the same phase as the second delayed clock signal DLL_CLK2 in response to the second delayed clock signal DLL_CLK2, and the second data strobe signal DQS2 is outputted to the second signal pad 140A.

The second data strobe signal DQS2 applied to the second signal pad 140A is transferred to the first internal connection terminal 112 through the second bonding wire W12 and is finally transferred to the external controller through the package substrate 110.

The first and second data strobe signals DQS1 and DQS2 transferred to the external controller in these ways have phases in which parameters tDQSCK indicating skews with respect to the external clock signal EX_CLK become the same. The reason to this resides in that, as described above, since the first data strobe signal DQS1 transferred through the first bonding wire W11 of the relatively short length is a signal derived from the first delayed clock signal DLL_CLK1 on which only the preset delay value is reflected and the second data strobe signal DQS2 transferred through the second bonding wire W12 of the relatively long length is a signal derived from the second delayed clock signal DLL_CLK2 on which the second delay value as well as the preset delay value is reflected, the second data strobe signal DQS2 has a phase in which the delay element of the second bonding wire W12 is compensated for.

According to the first embodiment of the present invention, even when the lengths of bonding wires vary depending upon a stack sequence of semiconductor chips, an AC parameter tDQSCK may be actively corrected. Therefore, the AC parameter tDQSCK may be controlled within a range defined in a specification.

Second Embodiment

A second embodiment of the present invention has a structure in which an area is minimized when compared to the first embodiment. Namely, while flag pads are additionally provided in the first embodiment, the second embodiment has a structure in which probe test pads provided to be used at a wafer level are utilized at a package level.

Figure 7:
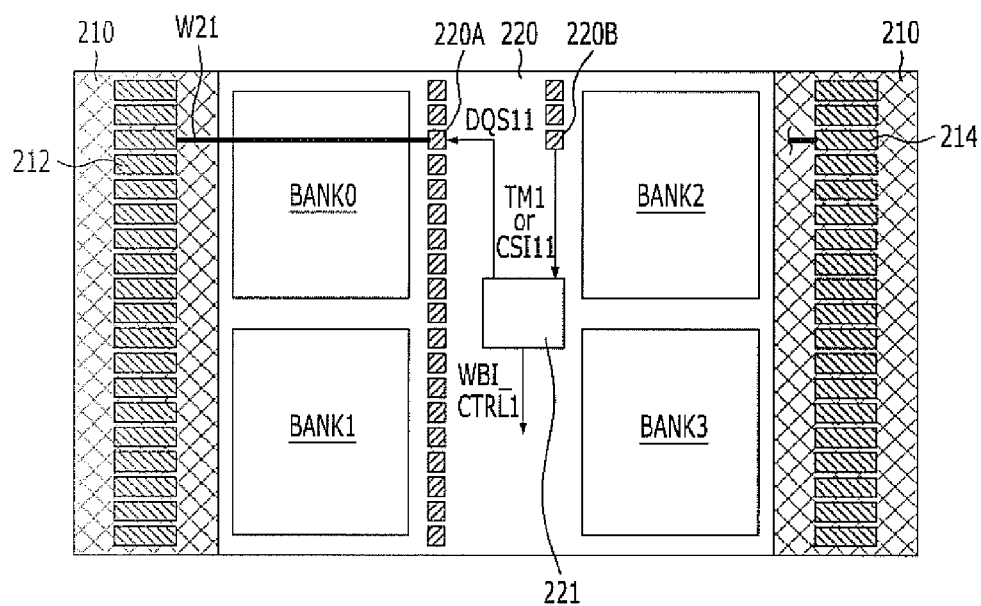
FIG. 7 is a plan view illustrating a package substrate and a first semiconductor chip first stacked on the package substrate in a semiconductor memory device (DDP) in accordance with a second embodiment of the present invention.

FIG. 7 is a plan view illustrating a package substrate 210 and a first semiconductor chip 220 first stacked on the package substrate 210 in a semiconductor memory device (DDP) in accordance with a second embodiment of the present invention.

Referring to FIG. 7, the semiconductor memory device (DDP) in accordance with the second embodiment of the present invention includes the package substrate 210 which includes first internal connection terminals 212, the first semiconductor chip 220 which is first stacked on the package substrate 210 and includes a first signal pad 220A for outputting a first data strobe signal DQS11, and a first wire W21 which electrically connects the first internal connection terminal 212 with the first signal pad 220A.

The package substrate 210 has a lower surface, on which a plurality of external connection terminals (not shown) for interfacing with an external controller (not shown) using various signals and power are disposed, and an upper surface on which a plurality of internal connection terminals for interfacing with the first semiconductor chip 220 and a second semiconductor chip 240 to be described below using various signals and power are disposed. For reference, corresponding terminals of the plurality of external connection terminals and the plurality of internal connection terminals are electrically connected with each other in a routing method.

The first semiconductor chip 220 includes a first wafer burn-in test pad 220B and a first circuit block 221.

The first wafer burn-in test pad 220B provides first wafer burn-in test information TM1 at a wafer level and provides first chip stack information CSI11 corresponding to a stack sequence of semiconductor chips at a package level. More specifically, at the wafer level, the first wafer burn-in test pad 220B is connected to a channel assigned to a probe test apparatus/equipment (not shown) and is applied with the first wafer burn-in test information TM1 from the probe test apparatus. The first wafer burn-in test pad 220B is a wafer test pad which is not generally used at the package level. In this regard, in the embodiment of the present invention, the first wafer burn-in test pad 220B is used to provide the first chip stack information CSI11 at the package level. That is to say, the first wafer burn-in test pad 220B is not connected with any internal connection terminal in a floating state at the package level, and due to this fact, the first chip stack information CSI11 has a high impedance (Hi-Z) value.

The first circuit block 221 is configured to perform a predetermined operation in response to the first wafer burn-in test information TM1 or the first chip stack information CSI11, and will be described in detail with reference to FIG. 8.

Figure 8:
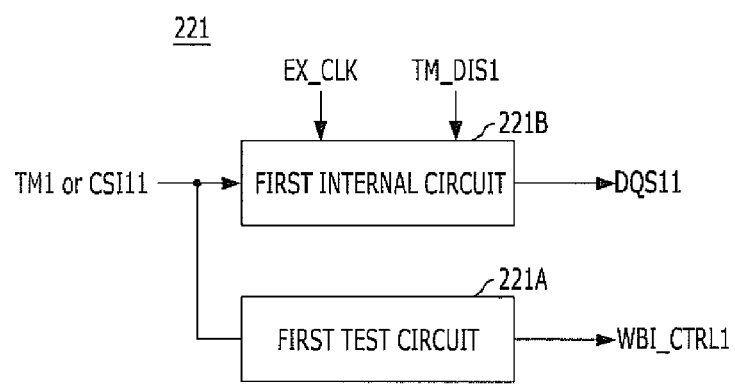
FIG. 8 is a block diagram illustrating an exemplary embodiment of the first circuit block shown in FIG. 7.

FIG. 8 is a block diagram illustrating the internal configuration of the first circuit block 221 shown in FIG. 7.

Referring to FIG. 8, the first circuit block 221 includes a first test circuit 221A configured to perform a wafer burn-in test operation in response to the first wafer burn-in test information TM1 provided from the first wafer burn-in test pad 220B at the wafer level and a first internal circuit 221B configured to correct or adjust an AC parameter by a first correction value in response to the first chip stack information CSI11 provided from the first wafer burn-in test pad 220B at the package level. The AC parameter means a parameter tDQSCK that indicates a skew between an external clock signal and a data strobe signal in a read operation.

Figure 9:
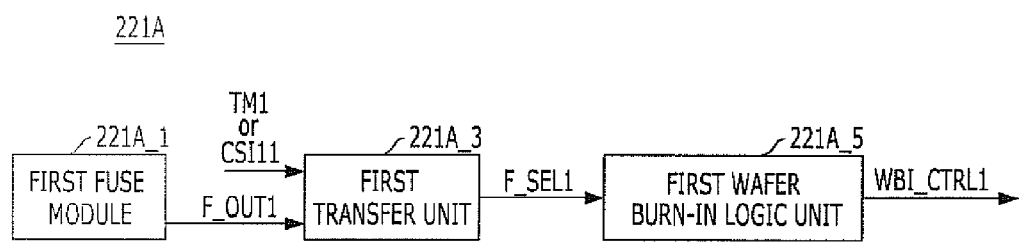
FIG. 9 is a block diagram illustrating an exemplary embodiment of the first test circuit shown in FIG. 8.
Figure 10:
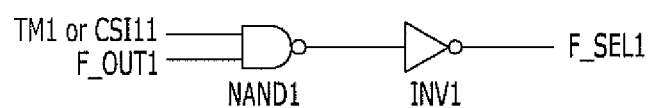
FIG. 10 is a circuit diagram illustrating an exemplary embodiment of the first transfer unit shown in FIG. 9.

FIG. 9 is a block diagram of the first test circuit 221A shown in FIG. 8, and FIG. 10 is an internal circuit diagram of a first transfer unit 221A_3 shown in FIG. 9.

Referring to FIG. 9, the first test circuit 221A includes a first fuse module 221A_1, the first transfer unit 221A_3 configured to selectively transfer the first wafer burn-in test information TM1 or the first chip stack information CSI11 in response to first fuse information F_OUT1 outputted from the first fuse module 221A_1, and a first wafer burn-in logic unit 221A_5 configured to generate a first wafer burn-in test control signal WBI_CTRL1 in response to a first transfer signal F_SEL1 selectively transferred from the first transfer unit 221A_3. Such a first test circuit 221A is enabled at the wafer level and is disabled at the package level. Precisely, the first wafer burn-in logic unit 221A_5 is enabled at the wafer level and is disabled at the package level. To this end, the first transfer unit 221A_3 may output the first transfer signal F_SEL1 for enabling the first wafer burn-in logic unit 221A_5 in response to the first wafer burn-in test information TM1 applied at the wafer level, and the first wafer burn-in logic unit 221A_5 may be disabled by cutting the fuse (not shown) included in the first fuse module 221A_1 as a probe test is completed. Referring to FIG. 10, the first transfer unit 221A_3 for determining whether to enable or disable the first wafer burn-in logic unit 221A_5 in this way includes a first NAND gate NAND1 for performing NAND operation on the first wafer burn-in test information TM1 or the first chip stack information CSI11 and the first fuse information F_OUT1 and a first inverter INV1 for inverting the output signal of the first NAND gate NAND1 and outputting the first transfer signal F_SEL1.

Figure 11:
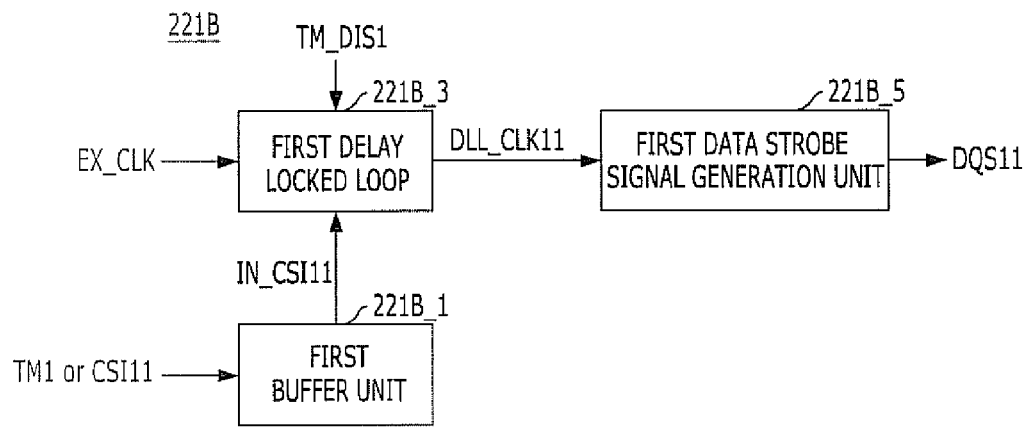
FIG. 11 is a block diagram illustrating an exemplary embodiment of the first internal circuit shown in FIG. 8.
Figure 12:
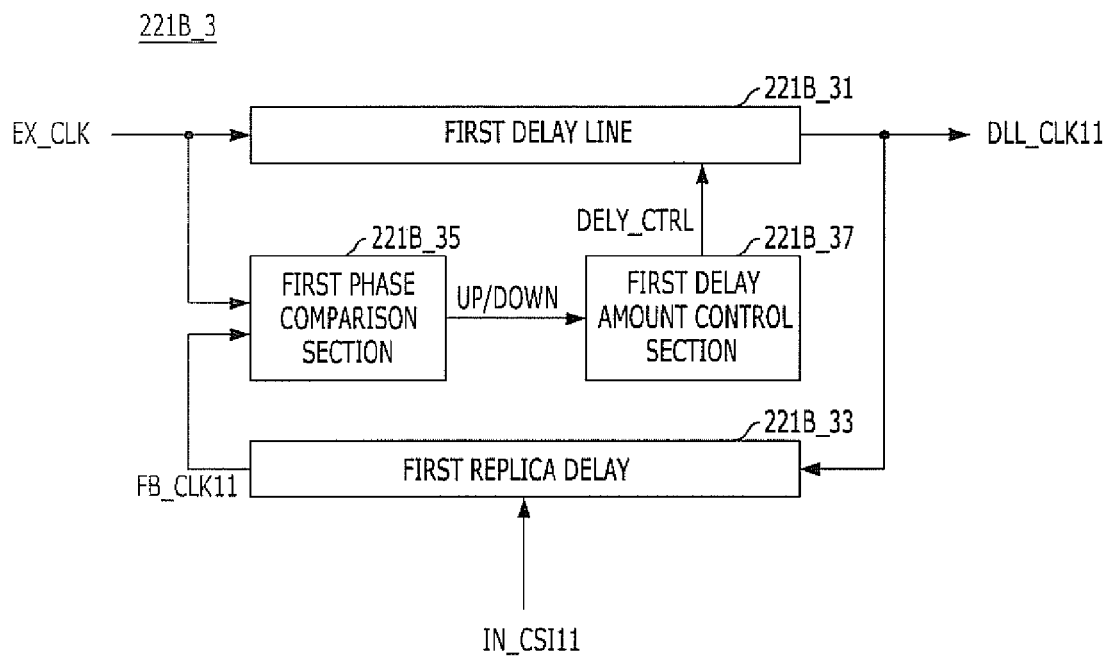
FIG. 12 is a block diagram illustrating an exemplary embodiment of the first delay locked loop shown in FIG. 11.

FIG. 11 is a block diagram of the first internal circuit 221B shown in FIG. 8, and FIG. 12 is a block diagram illustrating an exemplary embodiment of a first delay locked loop 221B_3 shown in FIG. 11.

Referring to FIG. 11, the first internal circuit 221B is configured to output a first data strobe signal DQS11 on which a first delay value corresponding to a first correction value is reflected, in order to correct or adjust an AC parameter tDQSCK by the first correction value in response to the first chip stack information CSI11. The first internal circuit 221B includes a first buffer unit 221B_1, the first delay locked loop 221B_3, and a first data strobe signal generation unit 221B_5. Since the first delay locked loop 221B_3 is disabled at the wafer level and is enabled at the package level in response to a first enable signal TM_DIS1, the component elements of the first internal circuit 221B will be described based on the operation of the package level for the sake of convenience in explanation.

The first buffer unit 221B_1 is configured to receive the first chip stack information CSI11 and output first internal chip stack information IN_CSI11. The first buffer unit 221B_1 may output the first internal chip stack information IN_CSI11 of a logic low level when the first chip stack information CSI11 of a high impedance (Hi-Z) value is inputted.

The first delay locked loop 221B_3 is configured to control the delay value of the first replica delay (see FIG. 12) included therein in response to the first internal chip stack information IN_CSI11, delay an external clock signal EX_CLK by the controlled delay value, and output a first delayed clock signal DLL_CLK11. Referring to FIG. 12, the first delay locked loop 221B_3 includes a first delay line 221B_31 configured to delay the external clock signal EX_CLK by a delay time for delay locking and output the delay locked first delayed clock signal DLL_CLK11, a first replica delay 221B_33 configured to delay the first delayed clock signal DLL_CLK11 by a delay value acquired by modeling an internal delay element as a default value and output a first feedback clock signal FB_CLK11 in which the first delay value is additionally included in the acquired delay value in response to the first internal chip stack information IN_CSI11, a first phase comparison section 22B_35 configured to compare the phases of the external clock signal EX_CLK and the first feedback clock signal FB_CLK11, and a first delay amount control section 221B_37 configured to generate a first control signal DELY_CTRL11 for controlling the delay amount of the first delay line 221B_31 in response to an output signal UP/DOWN of the first phase comparison section 22B_35.

Referring back to FIG. 11, the first data strobe signal generation unit 221B_5 is configured to generate the first data strobe signal DQS11 in response to the first delayed clock signal DLL_CLK11. Accordingly, the first data strobe signal DQS11 has the same phase as the first delayed clock signal DLL_CLK11.

Figure 13:
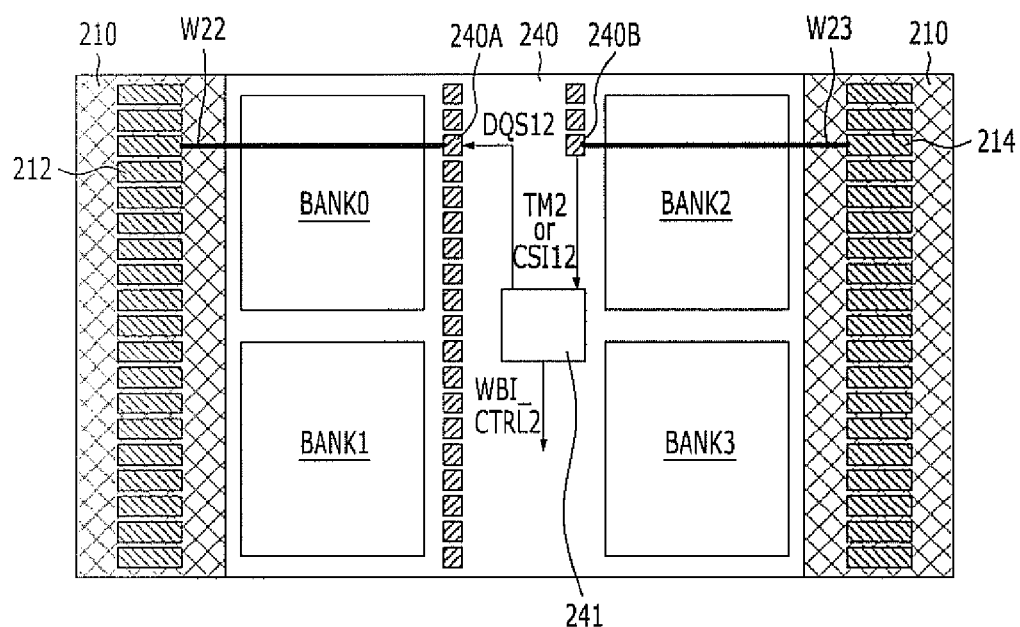
FIG. 13 is a plan view illustrating the package substrate and a second semiconductor chip second stacked over the package substrate in the semiconductor memory device (DDP) in accordance with the second embodiment of the present invention.

FIG. 13 is a plan view illustrating the package substrate 210 and a second semiconductor chip 240 second stacked over the package substrate 210, that is, over the first semiconductor chip 220, in the semiconductor memory device (DDP) in accordance with the second embodiment of the present invention.

Referring to FIG. 13, the semiconductor memory device (DDP) in accordance with the second embodiment of the present invention includes the package substrate 210 including first and second internal connection terminals 212 and 214, the second semiconductor chip 240 second stacked over the package substrate 210 and including a second signal pad 240A configured to output a second data strobe signal DQS12 and a second wafer burn-in test pad 240B configured to provide second wafer burn-in test information TM2 at the wafer level and provide second chip stack information CSI12 corresponding to a stack sequence of semiconductor chips at the package level, a second wire W22 configured to electrically connect the first internal connection terminal 212 with the second signal pad 240A, and a third wire W13 configured to electrically connect the second internal connection terminal 214 with the second wafer burn-in test pad 240B. The second internal connection terminals 214 are terminals for supplying a power supply voltage VDD applied from the external controller. At the wafer level, the second wafer burn-in test pad 240B is connected to a channel assigned to a probe test apparatus/equipment (not shown) and is applied with the second wafer burn-in test information TM2 from the probe test apparatus. For reference, the second wafer burn-in test pad 240B is a wafer test pad which is not generally used at the package level. In this regard, in the embodiment of the present invention, the second wafer burn-in test pad 240B is used to provide the second chip stack information CSI12 at the package level. That is to say, because the second wafer burn-in test pad 240B is connected with the second internal connection terminal 214 through a third bonding wire W23 at the package level, the second wafer burn-in test pad 240B is applied with the power supply voltage VDD from the second internal connection terminal 214, and due to this fact, the second chip stack information CSI12 has a logic high level.

As described above, the package substrate 210 functions to transfer signals and powers between the first and second semiconductor chips 220 and 240 and the external controller.

The second semiconductor chip 240 includes a second circuit block 241 configured to perform a predetermined operation in response to the second wafer burn-in test information TM2 or the second chip stack information CSI12 provided from the second wafer burn-in test pad 240B.

Figure 14:
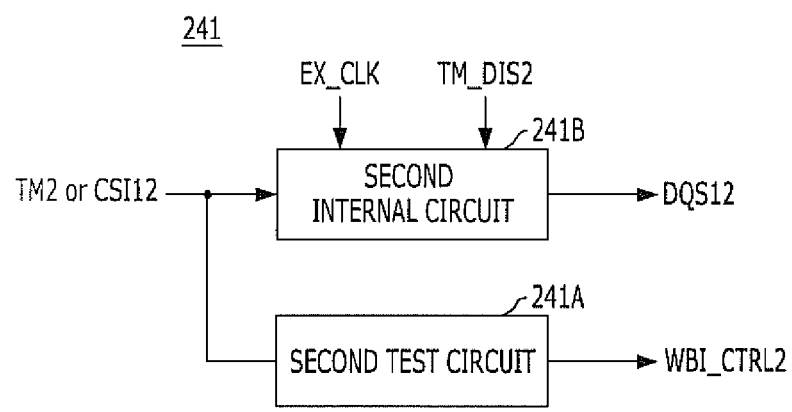
FIG. 14 is a block diagram illustrating an exemplary embodiment of the second circuit block shown in FIG. 13.

FIG. 14 is a block diagram illustrating the internal configuration of the second circuit block 241 shown in FIG. 13.

Referring to FIG. 14, the second circuit block 241 includes a second test circuit 241A configured to perform a wafer burn-in test operation in response to the second wafer burn-in test information TM2 provided from the second wafer burn-in test pad 240B at the wafer level and a second internal circuit 241B configured to correct or adjust an AC parameter by a second correction value in response to the second chip stack information CSI12 provided from the second wafer burn-in test pad 240B at the package level. The AC parameter means a parameter tDQSCK that indicates a skew between an external clock signal and a data strobe signal in a read operation.

Figure 15:
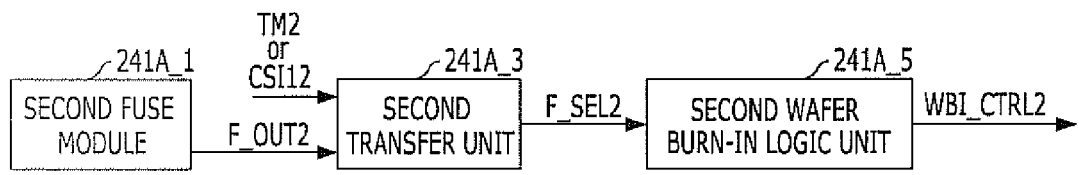
FIG. 15 is a block diagram illustrating an exemplary embodiment of the second test circuit shown in FIG. 14.
Figure 16:
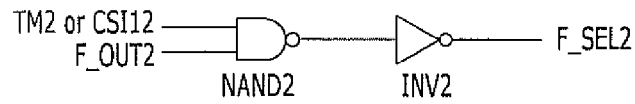
FIG. 16 is a circuit diagram illustrating an exemplary embodiment of the second transfer unit shown in FIG. 15.

FIG. 15 is a block diagram of the second test circuit 241A shown in FIG. 14, and FIG. 16 is an internal circuit diagram of a second transfer unit 241A_3 shown in FIG. 15.

Referring to FIG. 15, the second test circuit 241A includes a second fuse module 241A_1, the second transfer unit 241A_3 configured to selectively transfer the second wafer burn-in test information TM2 or the second chip stack information CSI12 in response to second fuse information F_OUT2 outputted from the second fuse module 241A_1, and a second wafer burn-in logic unit 241A_5 configured to generate a second wafer burn-in test control signal WBI_CTRL2 in response to a second transfer signal F_SEL2 selectively transferred from the second transfer unit 241A_3. Such second test circuit 241A is enabled at the wafer level and is disabled at the package level. Precisely, the second wafer burn-in logic unit 241A_5 is enabled at the wafer level and is disabled at the package level. To this end, the second transfer unit 241A_3 may output the second transfer signal F_SEL2 for enabling the second wafer burn-in logic unit 241A_5 in response to the second wafer burn-in test information TM2 applied at the wafer level, and the second wafer burn-in logic unit 241A_5 may be disabled by cutting the fuse (not shown) included in the second fuse module 241A_1 as a probe test is completed. Referring to FIG. 16, the second transfer unit 241A_3 for determining whether to enable or disable the second wafer burn-in logic unit 241A_5 in this way includes a second NAND gate NAND2 for performing NAND operation on the second wafer burn-in test information TM2 or the second chip stack information CSI12 and the second fuse information F_OUT2 and a second inverter INV2 for inverting the output signal of the second NAND gate NAND2 and outputting the second transfer signal F_SEL2.

Figure 17:
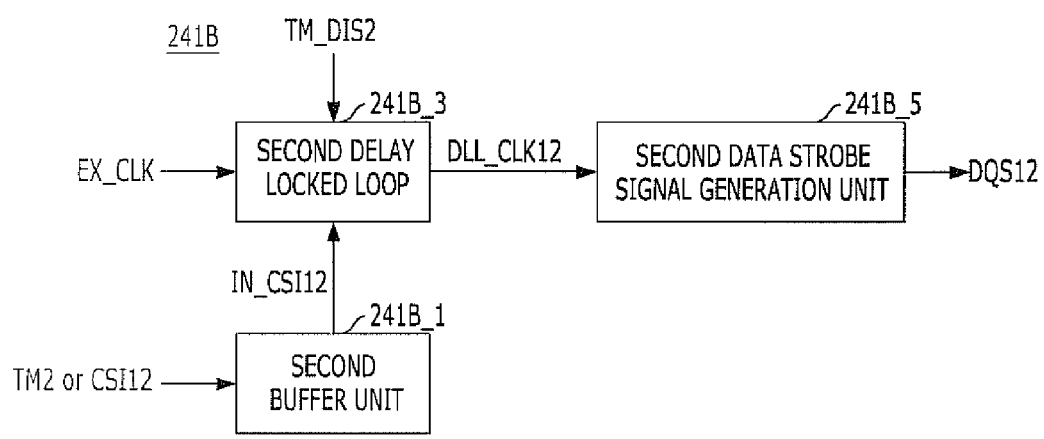
FIG. 17 is a block diagram illustrating an exemplary embodiment of the second internal circuit shown in FIG. 14.

FIG. 17 is a block diagram of the second internal circuit 241B shown in FIG. 14.

Referring to FIG. 17, the second internal circuit 241B is configured to output the second data strobe signal DQS12 on which a second delay value corresponding to a second correction value is reflected, in order to correct or adjust an AC parameter tDQSCK by the second correction value in response to the second chip stack information CSI12. The second internal circuit 241B includes a second buffer unit 241B_1, the second delay locked loop 241B_3, and a second data strobe signal generation unit 241B_5. Since the second delay locked loop 241B_3 is disabled at the wafer level and is enabled at the package level in response to a second enable signal TM_DIS2, the component elements of the second internal circuit 241B will be described based on the operation of the package level for the sake of convenience in explanation.

The second buffer unit 241B_1 is configured to receive the second chip stack information CSI12 and output second internal chip stack information IN_CSI12. The second buffer unit 241B_1 may output the second internal chip stack information IN_CSI12 of a logic high level when the second chip stack information CSI12 of a logic high level is inputted.

The second delay locked loop 241B_3 is configured to control the delay value of the second replica delay (not shown) included therein in response to the second internal chip stack information IN_CSI12, delay the external clock signal EX_CLK by the controlled delay value, and output a second delayed clock signal DLL_CLK12. Since the second delay locked loop 241B_3 has the same configuration as the first delay locked loop 221B_3 described above (see FIG. 12), detailed description thereof will be omitted herein. For reference, while the second replica delay included in the second delay locked loop 241B_3 is set to have a delay value modeled from an internal delay element as a default, the second delay value is additionally included in the set delay value in response to the second internal chip stack information IN_CSI12.

The second data strobe signal generation unit 241B_5 is configured to generate the second data strobe signal DQS12 in response to the second delayed clock signal DLL_CLK12. Accordingly, the second data strobe signal DQS12 and the second delayed clock signal DLL_CLK12 have the same phase.

Hereafter, operations of the semiconductor memory device (DDP) in accordance with the second embodiment of the present invention, configured as mentioned above, will be described.

First, operations at the wafer level are described.

First, wafer burn-in tests are performed for the first and second semiconductor chips 220 and 240 at the wafer level. Since the wafer burn-in tests for the first and second semiconductor chips 220 and 240 are performed through the same procedure, only the wafer burn-in test for the first semiconductor chip 220 will be representatively described for the sake of convenience in explanation.

The first wafer burn-in test pad 220B is connected to a channel assigned to a probe test apparatus and is applied with the first wafer burn-in test information TM1 through the assigned channel from the probe test apparatus. Then, the first transfer unit 221A_3 outputs the first transfer signal F_SEL1 of a logic high level to enable the first wafer burn-in logic unit 221A_5 in response to the first fuse information F_OUT1 and the first wafer burn-in test information TM1. Then, the first wafer burn-in logic unit 221A_5 generates the first wafer burn-in test control signal WBI_CTRL1 for performing the wafer burn-in test for banks BANK0 to BANK8 included in the first semiconductor chip 220. The first internal circuit 221B is disabled in response to the first enable signal TM_DIS1.

Thereafter, if the fuse included in the first fuse module 221A_1 is cut as the wafer burn-in test is completed, responding to the first fuse information F_OUT1 of a logic low level, the first transfer unit 221A_3 outputs the first transfer signal F_SEL1 of a logic low level to disable the first wafer burn-in logic unit 221A_5 regardless of any other input signals. Accordingly, the first wafer burn-in logic unit 221A_5 is disabled.

Next, operations at the package level are described.

In the case of the package level, in the second embodiment of the present invention, in the same manner as in the first embodiment, the case of correcting the AC parameter tDQSCK of the second semiconductor chip 240 based on the AC parameter tDQSCK of the first semiconductor chip 220 will be exemplified. That is, a second correction value has a predetermined value while a first correction value is '0'. In other words, since the first and second bonding wires W21 and W22 of different lengths have different delay elements, a series of operations for compensating for the delay element of the second bonding wire W22 are performed such that the delay element of the second bonding wire W22 having a relatively long length can correspond to the delay element of the first bonding wire W21 having a relatively short length.

First, since the first wafer burn-in test pad 220B of the first semiconductor chip 220 is not connected with any internal connection terminal which is disposed on the package substrate 210, the first wafer burn-in test pad 220B is in a floating state. According to this fact, the first chip stack information CSI11 provided through the first wafer burn-in test pad 220B has a high impedance (Hi-Z) value, and the first internal circuit 221B provided with the first chip stack information CSI11 outputs the first data strobe signal DQS11, on which only a modeled delay value is reflected, to the first signal pad 220A.

Describing in detail the operations of the first internal circuit 221, the first buffer unit 221B_1 outputs the first internal chip stack information IN_CSI11 of a logic low level in response to the first chip stack information CSI11 of the high impedance (Hi-Z) value. The first delay locked loop 221B_3 maintains the delay value of the first replica delay to have a preset default value in response to the first internal chip stack information IN_CSI11 of a logic low level, delay the external clock signal EX_CLK by the maintained delay value, and outputs the first delayed clock signal DLL_CLK11. The first data strobe signal generation unit 221B_5 generates the first data strobe signal DQS11 of the same phase as the first delayed clock signal DLL_CLK11 in response to the first delayed clock signal DLL_CLK11, and the first data strobe signal DQS11 is outputted to the first signal pad 220A.

The first data strobe signal DQS11 applied to the first signal pad 220A is transferred to the first internal connection terminal 212 through the first bonding wire W21 and is finally transferred to the external controller through the package substrate 210.

Since the second wafer burn-in test pad 240B of the second semiconductor chip 240 is connected with the second internal connection terminal 214 disposed on the package substrate 210, it is provided with the power supply voltage VDD. According to this fact, the second chip stack information CSI12 provided through the second wafer burn-in test pad 240B has a logic high level, and the second internal circuit 241 provided with the second chip stack information CSI12 of the logic high level outputs the second data strobe signal DQS2, on which a second delay value as well as the modeled delay value is reflected, to the second signal pad 240A.

Describing in detail the operations of the second internal circuit 241, the second buffer unit 241B_1 outputs the second internal chip stack information IN_CSI12 of a logic high level in response to the second chip stack information CSI12 of the logic high level. The second delay locked loop 241B_3 controls the delay value of the second replica delay to have the summed value of a preset default value and the second delay value in response to the second internal chip stack information IN_CSI12 of the logic high level, delays the external clock signal EX_CLK by the controlled delay value, and outputs the second delayed clock signal DLL-CLK12. The second data strobe signal generation unit 241B_5 generates the second data strobe signal DQS12 of the same phase as the second delayed clock signal DLL_CLK12 in response to the second delayed clock signal DLL_CLK12, and the second data strobe signal DQS12 is outputted to the second signal pad 240A.

The second data strobe signal DQS12 applied to the second signal pad 240A is transferred to the first internal connection terminal 212 through the second bonding wire W22 and is finally transferred to the external controller through the package substrate 210.

The first and second data strobe signals DQS11 and DQS12 transferred to the external controller in these ways have phases in which parameters tDQSCK indicating skews with respect to the external clock signal EX_CLK become the same. This reason to this resides in that, as described above, since the first data strobe signal DQS11 transferred through the first bonding wire W21 of the relatively short length is a signal derived from the first delayed clock signal DLL_CLK11 on which only the preset delay value is reflected and the second data strobe signal DQS12 transferred through the second bonding wire W22 of the relatively long length is a signal derived from the second delayed clock signal DLL_CLK12 on which the second delay value as well as the preset delay value is reflected, the second data strobe signal DQS12 has a phase in which the delay element of the second bonding wire W22 is compensated for.

According to the second embodiment of the present invention, advantages are provided in that an area can be minimized when compared to the first embodiment. Also, even when the lengths of bonding wires vary depending upon a stack sequence of semiconductor chips, an AC parameter tDQSCK may be actively corrected. Therefore, the AC parameter tDQSCK may be controlled within a range defined in a specification.

As is apparent from the above descriptions, the following effects may be achieved according to the embodiment in which flag pads are added and the embodiment in which pads already provided are used.

First, in the case that the flag pads are added, because AC parameters (tDQSCK) of a plurality of stacked semiconductor chips are actively corrected without an additional process, an erroneous operation can be prevented. For example, since an erroneous operation is prevented from occurring in a read operation of a semiconductor memory device, operational reliability and stability may be increased. Further, because the plurality of stacked semiconductor chips may be manufactured through the same mask patterning process, the manufacturing costs can be reduced and the manufacturing time can be shortened.

Next, in the case that the pads for other uses, e.g., test operations, are used, since pads are not additionally provided, the area of the semiconductor chip may be minimized when compared to the case that the flag pads are added. Also, because the corresponding embodiment may be applied to a semiconductor chip having a layout structure in which it is difficult for pads to be added, excellent applicability can be accomplished.

While the present invention has been described with respect to the specific embodiments, it will be apparent to those skilled in the art that various changes and modifications may be made without departing from the spirit and scope of the invention as defined in the following claims.

For example, while the semiconductor memory device (DDP) in which two semiconductor chips are stack-packaged was exemplarily described in the embodiments of the present invention, it may be applied to a semiconductor memory device in which at least three semiconductor chips are stack-packaged. In this case, at least two flag pads may be used, and the chip stack information provided through at least two flag pads may be applied by being decoded for respective semiconductor chips.

Also, while a parameter (tDQSCK) indicating a skew between an external clock signal and a data strobe signal was exemplarily described in the embodiments of the present invention, an AC parameter such as a data setup time (tDS) and a data hold time (tDH) may be corrected.

Moreover, while it was exemplarily described in the embodiments of the present invention that the AC parameter of a second stacked second semiconductor chip is corrected based on a first semiconductor chip first stacked on a package substrate, the AC parameter of a first semiconductor chip may be corrected based on a second semiconductor chip second stacked over a package substrate.

What is claimed is:

1. A semiconductor device comprising:
at least one first pad configured to provide wafer test information at a wafer level of the semiconductor device and provide chip stack information for a stack sequence of semiconductor chips at a package level of the semiconductor device;
at least one test circuit configured to perform a test operation in response to the wafer test information provided from the first pad at the wafer level; and
an internal circuit configured to adjust a parameter of the semiconductor device in response to the chip stack information provided from the first pad at the package level.

2. The semiconductor device of claim 1, wherein the internal circuit comprises:
a delay locked loop configured to delay an external clock signal by a delay time controlled in response to the chip stack information and generate a delayed clock signal; and
a data strobe signal generation unit configured to generate a data strobe signal in response to the delayed clock signal.

3. The semiconductor device of claim 2, wherein the delay locked loop is disabled at the wafer level and is enabled at the package level.

4. The semiconductor device of claim 2, wherein the internal circuit further comprises:
at least one input buffer unit configured to convert the chip stack information into a set level and output resultant information to the delay locked loop.

5. The semiconductor device of claim 2, wherein the delay locked loop comprises a replica delay having a delay value controlled in response to the chip stack information.

6. The semiconductor device of claim 2, wherein the parameter indicates a skew between the external clock signal and the data strobe signal.

7. The semiconductor device of claim 1, wherein the first pad comprises a wafer burn-in pad.

8. The semiconductor device of claim 7, wherein the test circuit is enabled at the wafer level and is disabled at the package level.

9. The semiconductor device of claim 7, wherein the test circuit performs a wafer burn-in test.

10. The semiconductor device of claim 1, wherein the test circuit comprises:
a fuse module;
a transfer unit configured to selectively transfer the wafer test information provided from the first pad in response to an output signal of the fuse module; and
a wafer burn-in logic unit configured to generate a wafer burn-in test control signal in response to the output signal of the transfer unit.

11. A semiconductor device comprising:
a package substrate having a plurality of external connection terminals disposed on a first surface thereof and a plurality of internal connection terminals disposed on a second surface thereof and electrically connected with corresponding one of the external connection terminals;
a first semiconductor chip stacked over the second surface of the package substrate and having a first pad for providing first wafer test information at a wafer level of the semiconductor device and providing first chip stack information for a stack sequence of the first semiconductor chip at a package level of the semiconductor device, a first test circuit for performing a test operation in response to the first wafer test information provided from the first pad at the wafer level, and a first internal circuit for adjusting a parameter of the semiconductor device by a first correction value in response to the first chip stack information provided from the first pad at the package level; and a second semiconductor chip stacked over the first semiconductor chip and having a second pad for providing second wafer test information at the wafer level and providing second chip stack information for a stack sequence of the second semiconductor chip at the package level, a second test circuit for performing a test operation in response to the second wafer test information provided from the second pad at the wafer level, and a second internal circuit for adjusting the parameter by a second correction value in response to the second chip stack information provided from the second pad at the package level.

12. The semiconductor device of claim 11, further comprising:
a first bonding wire configured to connect an internal connection terminal for providing a power supply voltage at the package level among the plurality of internal connection terminals with the first pad.

13. The semiconductor device of claim 12, wherein the second pad has a floating voltage state at the package level.

14. The semiconductor device of claim 12,
wherein the first internal circuit comprises:
a first delay locked loop configured to delay an external clock signal by a first delay time in response to the first chip stack information and generate a first delayed clock signal; and
a first data strobe signal generation unit configured to generate a first data strobe signal in response to the first delayed clock signal; and
wherein the second internal circuit comprises:
a second delay locked loop configured to delay the external clock signal by a second delay time in response to the second chip stack information and generate a second delayed clock signal; and
a second data strobe signal generation unit configured to generate a second data strobe signal in response to the second delayed clock signal.

15. The semiconductor device of claim 14, wherein the first and second delay locked loops are disabled at the wafer level and are enabled at the package level.

16. The semiconductor device of claim 14,
wherein the first internal circuit further comprises a first input buffer unit configured to convert the first chip stack information provided from the first pad into first internal information and output the internal information to the first delay locked loop, and
wherein the second internal circuit further comprises a second input buffer unit configured to convert the second chip stack information provided from the second pad into internal information and output the second internal information to the second delay locked loop.

17. The semiconductor device of claim 14,
wherein the first delay locked loop controls the first delay time using the first correction value in response to the first chip stack information, and
wherein the second delay locked loop maintains the second delay time as a default value in response to the second chip stack information.

18. The semiconductor device of claim 11, further comprising:
a second bonding wire configured to connect an internal connection terminal for providing a power supply voltage at the package level among the plurality of internal connection terminals with the second pad.

19. The semiconductor device of claim 18,
wherein the first and second internal circuits comprise first and second replica delays, respectively, and
wherein a delay value of the first replica delay is maintained as a default value in response to the first information and a delay value of the second replica delay is controlled using the second correction value in response to the second information.

* * * * *